United States Patent [19]
Maydan et al.

[11] Patent Number: 5,882,165
[45] Date of Patent: *Mar. 16, 1999

[54] MULTIPLE CHAMBER INTEGRATED PROCESS SYSTEM

[75] Inventors: Dan Maydan, Los Altos Hills; Sasson Somekh, Redwood City; David Nin-Kou Wang, Cupertino; David Cheng; Masato Toshima, both of San Jose; Isaac Harari, Mountain View; Peter D. Hoppe, Sunnyvale, all of Calif.

[73] Assignee: Applied Materials, Inc., Santa Clara, Calif.

[*] Notice: The term of this patent shall not extend beyond the expiration date of Pat. No. 4,951,601.

[21] Appl. No.: 926,568

[22] Filed: Sep. 10, 1997

Related U.S. Application Data

[63] Continuation of Ser. No. 746,181, Nov. 6, 1996, abandoned, which is a continuation of Ser. No. 574,564, Dec. 14, 1995, abandoned, which is a continuation of Ser. No. 408,444, Mar. 17, 1995, abandoned, which is a continuation of Ser. No. 17,553, Feb. 16, 1993, abandoned, which is a division of Ser. No. 808,786, Dec. 16, 1991, Pat. No. 5,292,393, which is a continuation of Ser. No. 482,331, Feb. 20, 1990, abandoned, which is a continuation of Ser. No. 451,817, Dec. 15, 1989, abandoned, which is a continuation of Ser. No. 371,700, Jun. 23, 1989, Pat. No. 4,951,601, which is a continuation of Ser. No. 283,015, Dec. 8, 1988, abandoned, which is a continuation of Ser. No. 944,803, Dec. 19, 1986, abandoned.

[51] Int. Cl.⁶ .................................................. C23C 16/00
[52] U.S. Cl. ........................ 414/217; 118/719; 414/331
[58] Field of Search ..................... 414/217, 331, 414/222, 937, 939; 118/719

[56] References Cited

U.S. PATENT DOCUMENTS

| | | | |
|---|---|---|---|
| 4,405,435 | 9/1983 | Tateishi et al. | 204/298 |
| 4,477,311 | 10/1984 | Mimura et al. | 156/643 |
| 4,501,527 | 2/1985 | Jacoby et al. | 414/225 |
| 4,547,247 | 10/1985 | Warenback et al. | 156/345 |
| 4,553,069 | 11/1985 | Purser | 315/111.81 |
| 4,584,045 | 4/1986 | Richards | 156/345 |
| 4,592,306 | 6/1986 | Gallego | 118/719 |
| 4,624,728 | 11/1986 | Bithell et al. | 156/345 |
| 4,705,951 | 11/1987 | Layman et al. | 414/217 |
| 4,722,298 | 2/1988 | Rubin et al. | 118/715 |
| 5,096,364 | 3/1992 | Messer et al. | 414/217 |

FOREIGN PATENT DOCUMENTS

| | | | |
|---|---|---|---|
| 264945 | 4/1988 | European Pat. Off. | H01L 21/00 |
| 59-112594 | of 0000 | Japan | B25J 17/00 |
| 57-149748 | 9/1982 | Japan | H01L 21/68 |
| 59-72739 | 4/1984 | Japan | H01L 21/68 |
| 61-8153 | 3/1986 | Japan | C23F 1/08 |
| 61-95887 | 4/1986 | Japan | B25J 9/04 |
| 61-112312 | 5/1986 | Japan | H01L 21/02 |
| 61-231738 | 10/1986 | Japan | H01L 21/68 |

OTHER PUBLICATIONS

IBM Technical Disclosure Bulletin vol. 20 No. 1, Jun. 1986 "Vacuum–Compatible Wafer Handler".

*Primary Examiner*—Thomas J. Brahan
*Attorney, Agent, or Firm*—Kenyon & Kenyon

[57] ABSTRACT

An integrated modular multiple chamber vacuum processing system is disclosed. The system includes a load lock, may include an external cassette elevator, and an internal load lock wafer elevator, and also includes stations about the periphery of the load lock for connecting one, two or several vacuum process chambers to the load lock chamber. A robot is mounted within the load lock and utilizes a concentric shaft drive system connected to an end effector via a dual four-bar link mechanism for imparting selected R—Θ movement to the blade to load and unload wafers at the external elevator, internal elevator and individual process chambers. The system is uniquely adapted for enabling various types of IC processing including etch, deposition, sputtering and rapid thermal annealing chambers, thereby providing the opportunity for multiple step, sequential processing using different processes.

8 Claims, 7 Drawing Sheets

MULTIPLE CHAMBER INTEGRATED PROCESS SYSTEM

This is a continuation of U.S. application Ser. No. 08/746,181, filed Nov. 6, 1996, now abandoned, which is a continuation of U.S. application Ser. No. 08/574,564, filed Dec. 14, 1995, now abandoned, which is a continuation of U.S. application Ser. No. 08/408,444, filed Mar. 17, 1995, now abandoned, which is a continuation of U.S. application Ser. No. 08/017,553, filed Feb. 16, 1993, now abandoned, which is a Divisional of U.S. application Ser. No. 07/808,786, filed Dec. 16, 1991, now U.S. Pat. No. 5,292,393, which is a continuation of U.S. application Ser. No. 07/482,331, filed Feb. 20, 1990, now abandoned, which is a continuation of U.S. application Ser. No. 07/451,817, filed Dec. 15, 1989, now abandoned, which is a continuation of U.S. application Ser. No. 07/371,700, filed Dec. 14, 1995, now U.S. Pat. No. 4,951,601, which is a continuation of U.S. application Ser. No. 07/283,015, filed Dec. 8, 1988, now abandoned, which is a continuation of U.S. application Ser. No. 06/944,803, filed Dec. 19, 1986, now abandoned.

BACKGROUND OF THE INVENTION the present invention related to a multiple chamber silicon wafer VLSI processing system that includes a common load lock and wafer exchange robot and multiple process chambers suitable for sequentially and simultaneously performing different process steps such as deposition and/or dry etching of dielectric, semiconductor and conductor layers. The invention also relates to apparatus for performing multiple integrated processing steps in a continuous sequence, that is, by routing semiconductor wafers between different processing chambers while the system is closed and under vacuum.

Presently, the typical available VLSI processing reactor systems are single chamber batch-type systems in which the chamber is dedicated to a single type of process such as plasma etching or chemical vapor deposition. These process-dedicated batch-type reactor chambers are designed to provide a high processing throughput for a single process step such as, for example, the chemical vapor deposition of silicon or silicon dioxide or other dielectric or the etching of such layers.

To our knowledge, there are available very few systems that are capable of performing more than one process step in-situ. One of the few exceptions is the magnetron-enhanced gas chemistry plasma reactor described in allowed, co-pending, commonly assigned U.S. patent application Ser. No. 814,638, entitled "Magnetron-Enhanced Plasma Etching Process", filed Dec. 30, 1985, in the name of Maydan et al. The magnetron RIE mode plasma etch reactor described in the Maydan et al application is a modification of the plasma system disclosed in allowed, co-pending, commonly assigned U.S. patent application Ser. No. 664,657, entitled "Apparatus and Method for Magnetron-Enhanced Plasma-Assisted Chemical Vapor Deposition", filed Oct. 25, 1984, in the name of Foster et al. In particular, the Foster et al patent application discloses the in-situ, sequential or simultaneous deposition and etching of layers on a semiconductor wafer. The Maydan and Foster applications are hereby incorporated by reference.

Secondly, single chamber etcher systems are available having an associated vacuum load lock that is used for pre- or post-processing.

Thirdly, an article in the October, 1985 issue of Semiconductor International magazine, entitled "Dry Etching Systems: Gearing up for Larger Wafers", pp. 48–60, schematically portrays a four-chamber dry etching system that uses a common load lock to transfer wafers to the individual etch chambers.

SUMMARY OF THE INVENTION

Objects of the Invention

In view of the above-described state of the art, it is one object of the present invention to provide a compact, multiple process chamber system that has the ability to perform different processes, simultaneously on different wafers and/ or sequentially on the same wafer, while the system is closed to atmosphere.

It is an additional, related object of the present invention to provide a multiple chamber semiconductor processing system that has integrated process capability. That is, a number of separate process steps involving distinctly different types of processes such as plasma etching, CVD deposition, physical sputtering and rapid thermal annealing can be performed simultaneously or sequentially on one or more wafers while the system is closed to vacuum.

It is an additional object of the present invention to provide a semiconductor integrated circuit wafer processing system having the above advantages and, in addition, having the capability to perform pre- or post-processing conditioning steps in the associated load lock chamber.

It is still another object of the present invention to provide an VLSI semiconductor wafer processing system having the above advantages and characteristics and which, in addition, incorporates a simple two-axis (R-Θ) robotic load lock wafer exchange system and a one-axis robot wafer exchange system within the individual chambers. These robot systems cooperatively provide an overall very compact yet relatively simple wafer handling system that has the additional attributes of inherent low particulate generation as well as isolation of friction surfaces from the wafers.

SUMMARY OF THE INVENTION

In one aspect, the present invention which accomplishes the above objectives is embodied in an integrated vacuum process system which comprises a vacuum load lock chamber having at least one and preferably a plurality or multiplicity of vacuum processing chambers mounted to the exterior thereof and communicating with the load lock chamber interior via selectively closable slits in the load lock and processing chambers. Each of the processing chambers can be adapted to perform one or more processes selected from, for example, gas chemistry etching, gas chemistry deposition, physical sputtering and rapid thermal anneal of one or more wafers positioned within the chamber. Each processing chamber includes robot means for reversibly transferring a wafer from a selected internal position adjacent the processing chamber opening to an internal wafer support. The load lock chamber incorporates a first external wafer elevator which is adapted for positioning wafers adjacent a load lock chamber entrance and a second internal elevator which is adapted for moving wafers to an internal position adjacent the entrance. An R-Θ wafer-handling robot is mounted within the load lock chamber and, preferably, comprises a horizontal wafer-holding blade, a dual-four bar link mechanism mounting the blade. Concentric drive shafts effect rotation of the blade via the four-bar link mechanism to selectively position the blade at the processing chambers and elevators and, extend and retract the blade, also via the four-bar link mechanism, to position the blade at the elevators and at the selected internal positions in the processing chambers for loading and unloading wafers.

In another aspect, at least one of the processing chambers includes a wafer-supporting electrode. The process chamber robot means comprises a group of vertically oriented pins, support means mounting the pins in a circular array, and means for moving the support means vertically to remove the wafer from the blade at the selected internal position and transport the wafer to the support electrode and to return the wafer to the blade at the selected internal position. This robot may include a wafer clamp ring mounted to the support ring above the wafer support pins for clamping the wafer to the supporting electrode.

In still another aspect, the robot of at least one of the processing chambers comprises a first generally circular horizontal array of fingers adapted for holding the wafers; a second generally circular horizontal array of fingers interdigitated with the first fingers and being adapted for holding a generally circular susceptor in a horizontal orientation; a first elevator for mounting the first fingers and moving the first fingers (a) upwardly to lift the wafer off the blade preparatory to lifting movement of the second fingers into a processing position and (b) downwardly to return the wafer to the selected internal position and the load lock blade; and a secondly vertically movable elevator mechanism mounting the second fingers for moving the second fingers (c) upwardly past the first fingers to lift the wafer therefrom onto the susceptor and into the processing position and (d) downwardly for depositing the processed wafer onto the first fingers preparatory to return by the first fingers to the selected internal position and the load lock blade.

A second integrated vacuum processing system essentially identical to the above-described first system, but without the external cassette elevator can be mounted to the first system at one, several or all of the process chamber mounting locations to increase the processing capability and throughput.

The load lock chambers can be adapted for processing and conditioning wafers therein and can include a plate intermediate upper and lower groups of wafer positions for sealing the upper group within the load lock chamber and isolating the lower group from the process chamber during handling or processing of the upper group.

BRIEF DESCRIPTION OF THE DRAWINGS

The above and other aspects and advantages of the present invention are described in conjunction with the following drawing figures, in which.

DETAILED DESCRIPTION OF THE INVENTION

Figure 1:
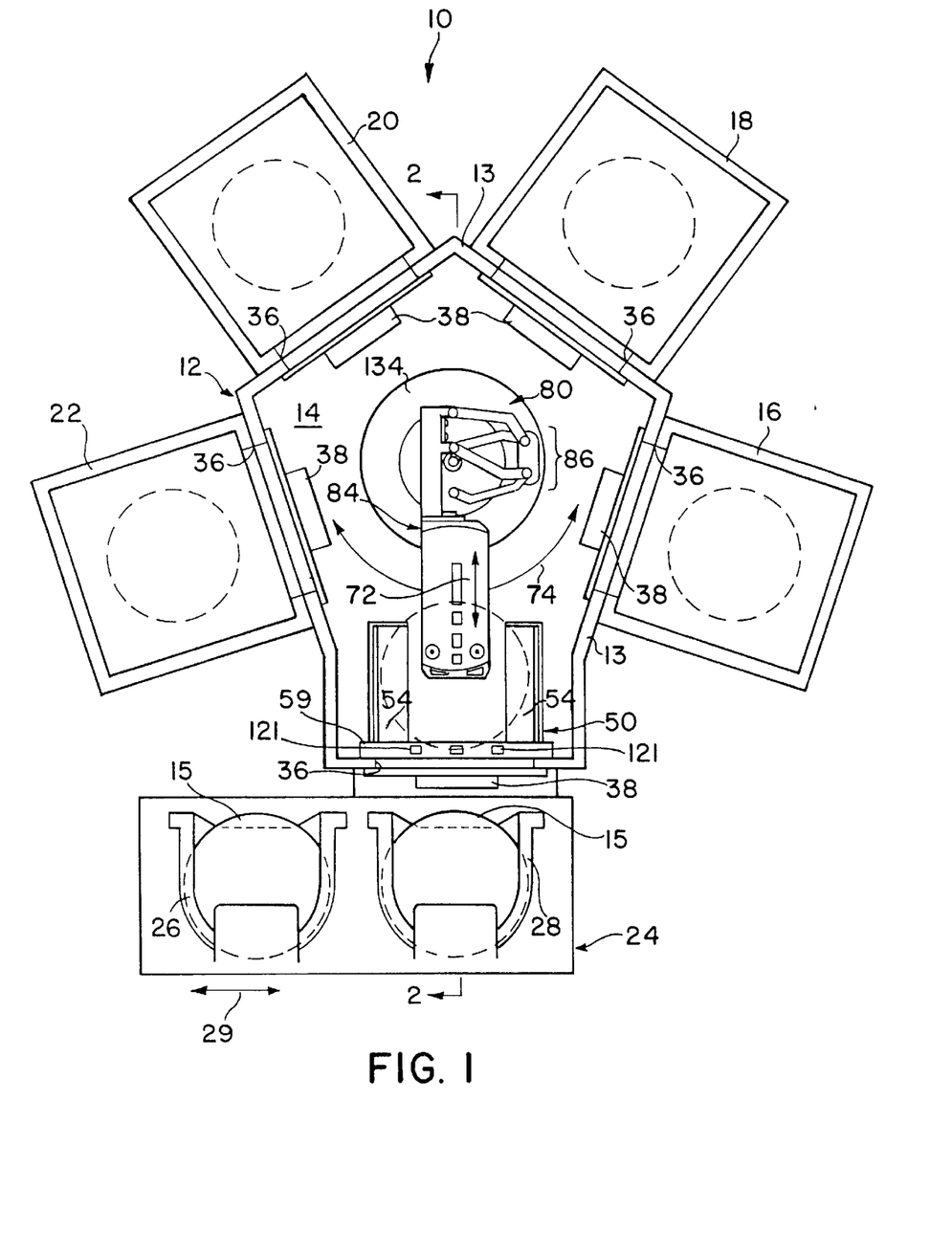
FIG. 1 is a simplified top plan view, partly schematic, of our multiple chamber integrated process system, illustrated with the load lock and chamber covers deleted.
Figure 2:
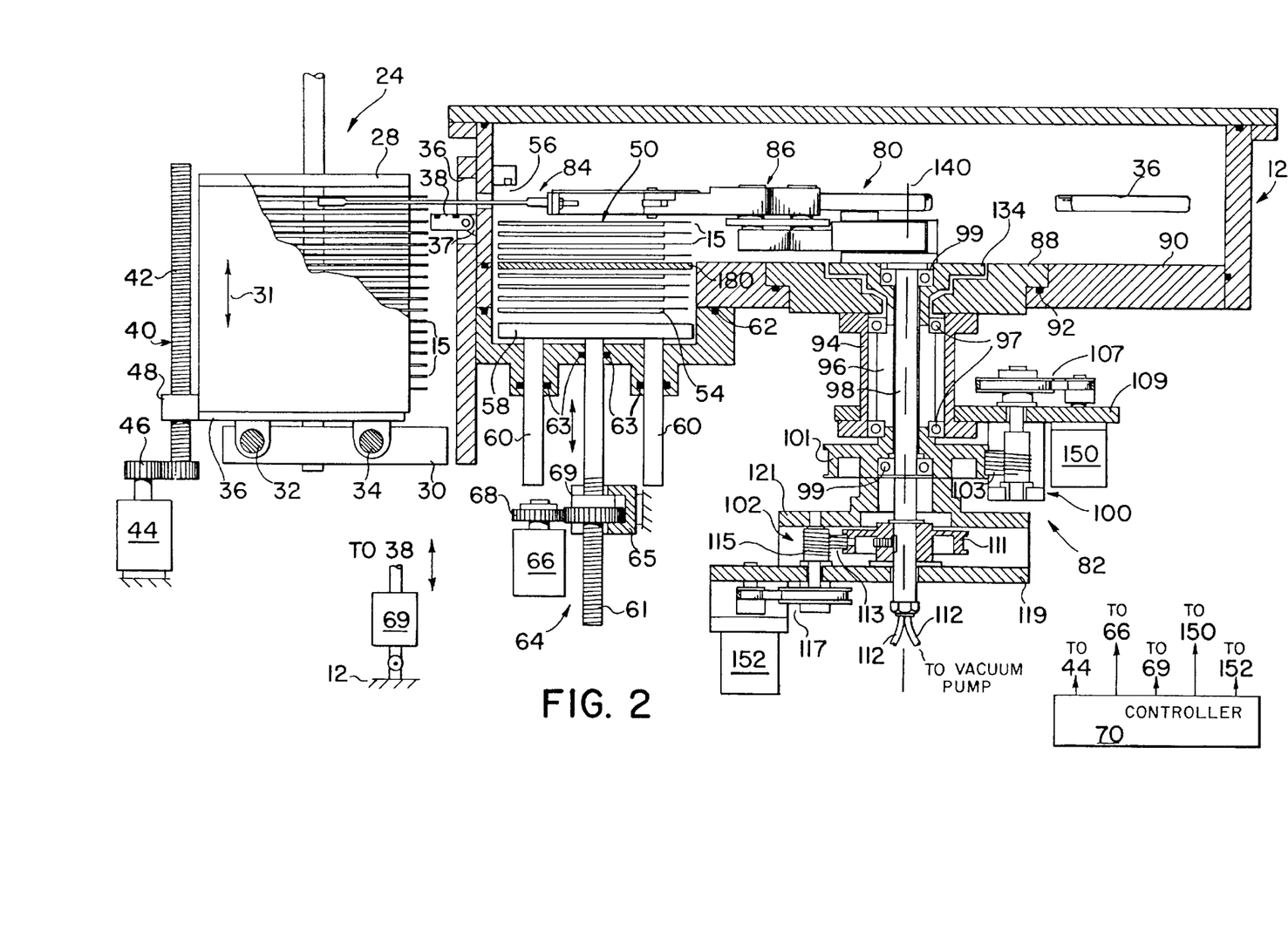
FIG. 2 is a vertical cross-section view, partly schematic, taken along line 2—2 in FIG. 1.

FIG. 1 is a top plan view of a presently preferred embodiment of our multiple chamber integrated process system 10. FIG. 2 is a vertical cross-section of system 10.

Referring primarily to FIGS. 1 and 2, our multiple chamber integrated process system 10 (also termed "multiple chamber system") comprises an enclosed, generally pentagonal main frame or housing 12 having five sidewalls 13—13 that define an enclosed vacuum load lock enclosure or chamber 14.

A number of individual vacuum processing reactors (or chambers), illustratively chambers 16, 18, 20 and 22, are mounted one each on an associated sidewall of the load lock housing.

An external cassette elevator 24 is adapted for holding a multiplicity of cassettes, illustratively two cassettes 26 and 28, in a vertical position with the wafers 15—15 horizontal. The external cassette elevator assembly 24 comprises a first, horizontal base plate 30 that is mounted on guide shafts 32 and 34 for reciprocal horizontal indexing movement, as indicated by arrow 29 (FIG. 1), to selectively position each cassette directly opposite and aligned with load lock chamber entrance slit or opening 36. For example, the base plate 30 can be mounted to and driven by a two-position air cylinder-actuated bell crank which is controlled by computer 70. The cassette elevator 24 is also adapted by indexing system 40 for reciprocal vertical indexing movement as indicated by arrow 31 (FIG. 2), to selectively present wafers within the cassette adjacent to the load lock slit 36. Vertical cassette-indexing system 40 comprises a lead screw 42 that is rotated by a motor 44-driven gear set 46 for displacing drive nut 48 mounted to the base plate 30.

The process chambers 16–22 and the associated main frame walls 13—13 also have communicating slits 36—36 which are similar or identical to the load lock entrance slit 36. Doors or slit valves 38 are provided for sealing these access slits 36. Referring to FIG. 1, each door 36 is pivotally mounted as at 37 and can be opened and closed, e.g., by an air cylinder 69 controlled by computer 70. That is, the means such as electrically operated valves for controlling application of air to cylinder 69 are controlled by computer 70.

The load lock chamber has an internal storage elevator assembly 50 that holds a number of wafers 15—15, illustratively up to eight, on horizontal support plates 54. The elevator 50 indexes the wafers vertically to present the wafers to the vertical position 56 for loading and unloading by the load lock robot blade assembly 84, as discussed below.

Typically, the internal storage elevator cassette assembly 50 comprises a base plate 58 and slotted vertical front plate 59 to which the horizontal wafer support plates 54—54 are mounted. In the illustrated embodiment, a pair of guide shafts 60—60 and drive shaft 61 can extend downwardly from the base plate 58 and through the load lock chamber's bottom wall 62 via seals 63—63, for guiding and moving the elevator assembly 50. Elevator assembly 50 can be raised and lowered by a vertical indexing system 64 comprising a lead screw 65 that is rotated by a motor 66-driven gear set 68 for displacing drive nut 69 that is mounted to the vertical shaft 61. The operation of the elevator vertical drive motor 66 as well as cassette horizontal drive motor 44 (preferably stepper motors) is controlled by a conventional controller, a small, general purpose computer or personal computer 70.

Robotic wafer transfer system 80 is mounted within the load lock chamber 12 for transferring the wafers 15—15 between the external elevator 24 and the internal elevator 50, between the internal elevator 50 and the individual processing chambers 16–22, and between the processing chambers 16–22. The robot 80 includes a concentric-shaft, rotational drive system 82 that imparts reversible R-Θ movement to blade assembly 84 via a dual, four-bar link mechanism 86 for effecting the desired cassette-to-elevator, elevator-to-chamber and chamber-to-chamber wafer transfer. The R movement (straight line extension and retraction) is indicated by arrow 72, FIG. 1, while the pivotal Θ movement is along arrow 74.

Robot 80

Referring further to FIG. 2, the robot assembly 80 includes a removable base plate 88 that is mounted to the bottom wall 90 of load lock housing 12. O-ring 92 seals the two joined members. Fixed hollow outer shaft 94 is mounted to the base plate 88. Hollow middle shaft 96 is mounted for rotation within the outer shaft 94 by journal bearings 97-97. An inner shaft 98 is mounted by journal bearings 99-99 within the middle shaft 96. The concentric middle shaft 96 and inner shaft 98 are independently rotated, typically by stepper motor-controlled cable and drum drive mechanisms 100 and 102, respectively. The operation of respective stepper motors 150 and 152 is controlled by the controller/computer 70. As discussed below, rotation of the inner shaft 98 and of the outer shaft 96 are converted into precise R and Θ movement, respectively, of the robot blade assembly 84 by the dual four-bar link mechanism 86.

Drive mechanism 100 comprises a drum 101 which is tied in fixed relationship to middle shaft 96 and is rotated by cable 103. The cable 103 is mounted on, and wound on and unwound from, a drum 105 that is rotated by motor 150-driven belt and pulley system 107. The drum 105, belt and pulley system 107 and motor 150 are mounted on support plate 109, which in turn is mounted to the fixed outer shaft 94. As a consequence of this arrangement, rotation of the motor 150 is translated by cable 103 into rotation of disk 101 and middle shaft 96.

Similarly, drive mechanism 102 comprises a disk or drum 111 which is tied to inner shaft 98 and is rotated by a cable 113. Cable 113 is mounted on a drum 115, which is rotated by motor 152-driven belt and pulley system 117. Drum 115, belt and pulley system 117 and drive motor 152 are mounted on a support plate assembly 119 which itself is mounted to or is part of a member 121. In turn, member 121 is affixed to or is part of the disk or drum 101. As mentioned, disk 101 is tied to and rotates middle shaft 96. Thus, when drive system 100 rotates middle shaft 96 by rotating the connected disc 101, the disc 101 also rotates the drive system 102, thereby maintaining the angular position of shaft 98 with respect to middle shaft 96.

Figures 3, 4, 5, 6:
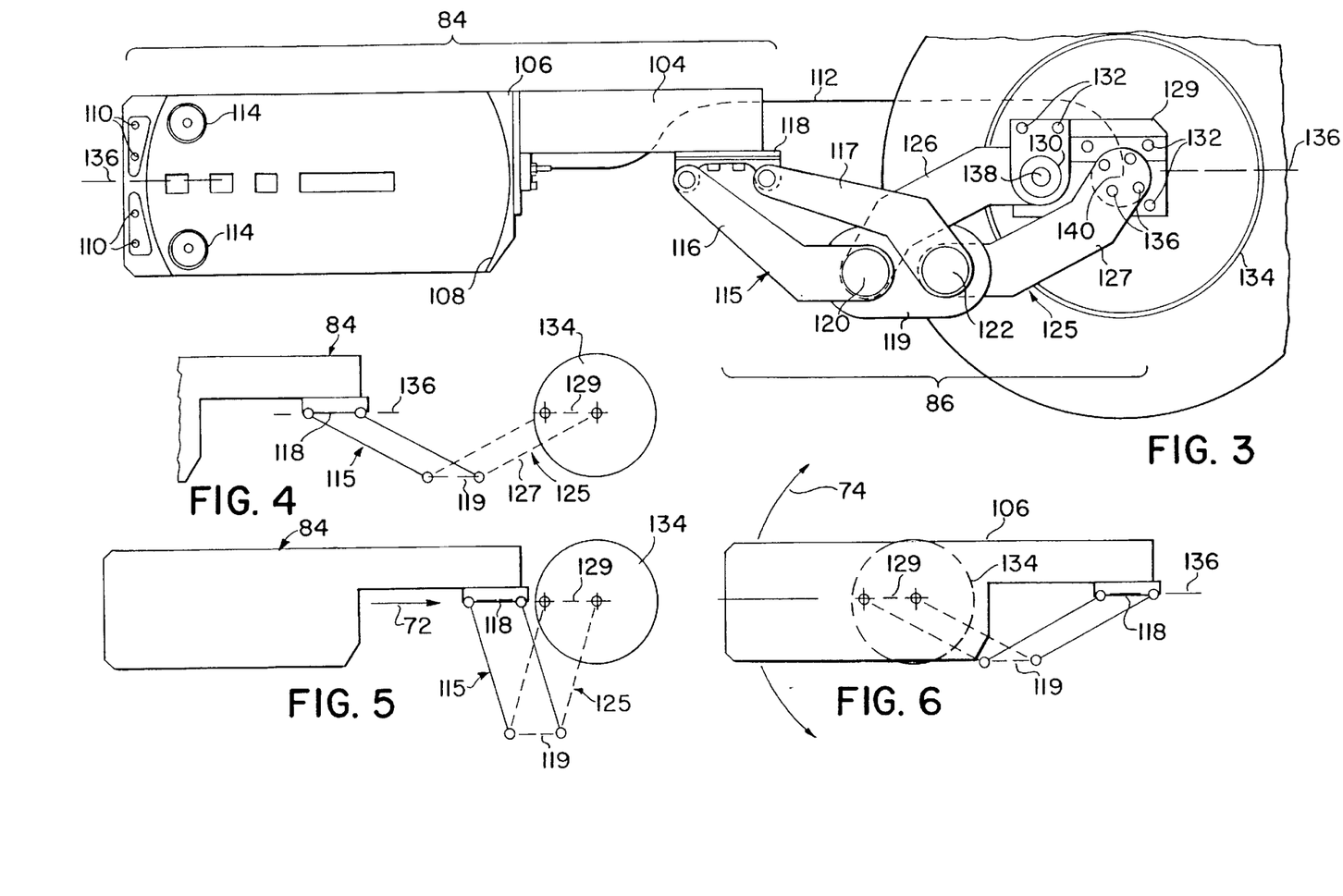
FIG. 3 is an enlarged, partial top plan view of the robotic wafer handling blade assembly shown in FIG. 1.
FIGS. 4, 5 and 6 diagrammatically depict the operation of the wafer handling blade assembly's dual four-bar link mounting system.
Figure 7:
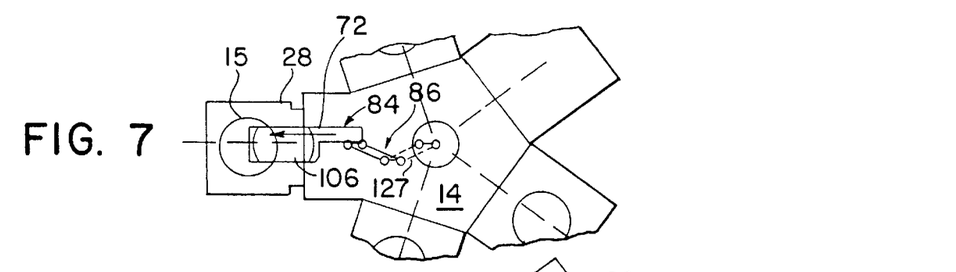
FIGS. 7–11 are highly schematized partial top plan views that diagrammatically depict the R-Θ movement of the load lock robot in transferring wafers among the external cassette elevator, the internal load lock elevator and the vacuum processing chambers.

Referring primarily to FIGS. 1 and 3, the blade assembly 84 includes arm 104 and a replaceable metal blade or end effector 106 mounted thereto which has a circular pocket 108 for receiving a wafer 15 of a given size. Replaceable blades 106 having different sized pockets 108 can be used to hold different sized wafers. Blade 106 has holes 110—110 adjacent the outer end that are connected to a vacuum pump (not shown) by vacuum line 112, which is routed through the hollow inner shaft 98 (FIG. 2). Thus, blade 106 can operate as a vacuum pick, in which case the wafers are picked up at the end of the blade from cassettes 26 and 28 or deposited into the cassettes, in the external atmospheric pressure ambient.

Alternatively, the pocket 108 can be used to hold wafers during transfer between the internal load lock elevator 50 and the processing chambers 16–22 or between the process chambers, in the load lock's vacuum ambient. In short, the blade can pick up wafers at atmospheric pressure or in vacuum, and can pick up high temperature wafers.

Referring further to FIG. 3, capacitive sensors 114—114 are mounted at the forward end of the blade 106 just aft of the vacuum holes 110—110 for use in sensing the presence/absence of a wafer 15 on the vacuum pick end or in the pocket 108. Electrical leads 115 for the sensors can be routed via inner shaft 98 to computer 70, where the output signals from the sensors 114—114 are used to determine the presence/absence of the wafer 15 on the blade. Also, the output of a plurality of (three) LED optical sensors 121 can be routed along the same path as leads 115 to the computer for detecting the insertion of wafers into the load lock chamber.

The dual four-bar link mechanism 84 comprises a first, four-bar link 115. which itself comprises first and second, parallel arms 116 and 117 that are pivotally mounted at spaced points along a connecting link/bracket 118. The second ends of the arms are mounted at spaced points along a second connecting link 119.

A second four-bar link 125 comprises first and second arms 126 and 127 that are pivotally mounted in common with arms 116 and 117, respectively, to the link 119. Arm 126 is mounted at the second end thereof to bracket 129 via pivot pin 130. The bracket 129 itself is fixedly mounted by screws 132—132 to disk or collar 134 which is mounted to the upper end of the middle shaft 96. Arm 127 is fixedly mounted by screws 136—136 to the upper end of inner shaft 98, which extends through the collar 134.

Because of this cooperative mounting using common link 119, the reversible rotation of the inner shaft 98 rotates the drive arm 127 and thereby transforms the shaft rotation into bidirectional translation of link 118 and arm assembly 84. As a consequence of the fixed relative positions of the pivot points 120 and 122 on link 119, of pivot points 138 and 140 on link 129, and of the pivot points on link 118, the two, four-bar links 115 and 125 maintain their parallelogram configuration during rotation. The movement of the link 118 and blade assembly 84 is thus parallel to (along) axis 136 through the pivot points associated with link 118 and link 129.

FIGS. 4, 5 and 6 illustrate movement of the four-bar links 115 and 125 during rotation of the shaft 98 and drive arm 127. Initially, as shown in FIG. 4, the link assemblies 115 and 125 are fully extended to position the vacuum pick end of the blade 106 to pick up or deposit a wafer at the external cassette 26 or 28.

Referring to FIG. 5, rotation of the inner shaft 98 and drive arm 127 moves link 118 inwardly into the load lock chamber 19, thereby retracting blade 106 (R movement) to the position over the inner elevator 52 for picking up or depositing a wafer from the inner elevator.

Upon additional rotation, as shown in FIG. 6, the four-bar link assembly 115 crosses over the assembly 125 so that link 118 and blade 106 are fully retracted and the blade is over the flange 134, forming a very compact configuration. In this retracted, compact configuration, the blade assembly 84 and the four-bar links 115 and 125 occupy a minimum area and, thus, traverse a relatively small area of the load lock chamber during rotation. The desired rotation (Θ movement) along path 74 is effected by rotating middle shaft 96 and flange 134, which, in turn, rotates pivot point 138 and the four-bar link mechanism 86 about the inner shaft axis 140 (FIG. 2).

The R-Θ movement of the robot 80 inserts the blade 106 through the slit valve 30 into a selected process chamber (see, for example, FIG. 11) over the wafer support susceptor or electrode within that chamber. Within the chamber, preferably a cooperating one-axis bidirectional vertical movement robot lifts the wafer from the blade 106, transfers the wafer to the associated chamber electrode or susceptor for processing, then returns the wafer to the reinserted blade 106 after processing. Co-pending, commonly assigned U.S. patent application Ser. No. 07/944,492, entitled "Thermal CVD/PECVD Reactor and Use for Thermal Vapor Deposition of Silicon Dioxide and In-Situ Multi-Step Planarized Process" concurrently filed, in the names of John A. Adamik, Kenneth S. Collins, Ilya Perlov, Sal P. Umotoy, Cissy Leung, John M. White, David N. K. Wang, Dan Maydan and Kam Law, discloses a chemical vapor deposition/plasma-enhanced chemical vapor reactor system adopted for thermal chemical vapor deposition (CVD), plasma-enhanced chemical vapor deposition (PECVD), plasma etchback, reactor self-cleaning, and sputtering film topography modification (also called "referenced CVD reactor".) The referenced CVD reactor has a one-axis bidirectional robot system uniquely adapted for the above-described internal wafer transfer in such reactors. In addition, co-pending, commonly assigned U.S. patent application Ser. No. 944843, entitled "Magnetic Field-Enhanced Plasma Etch Reactor", concurrently filed, in the names of Dana L. Andrews, David Cheng, Mei Chang, Dan Maydan, Sasson Somekh, Kenneth R. Stalder, John M. White, Jerry Y. Wong, Vladimir J. Zeitlin and David N. K. Wang (also called "referenced etch reactor"), describes a multiple process etch reactor having a single axis robot which is uniquely designed for etch reactors. The referenced CVD reactor patent application and the referenced etch reactor patent application are both incorporated by reference.

Operation of Robot 80

Figure 10:
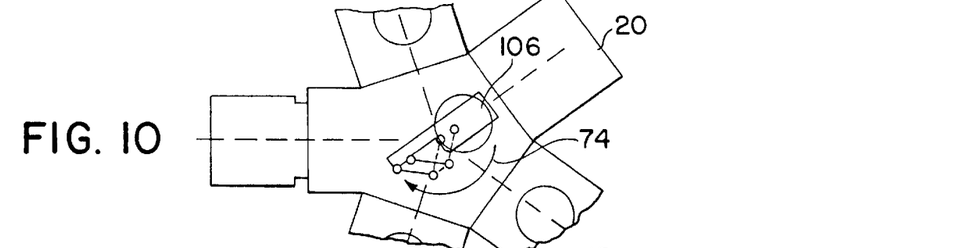
Figure 11:
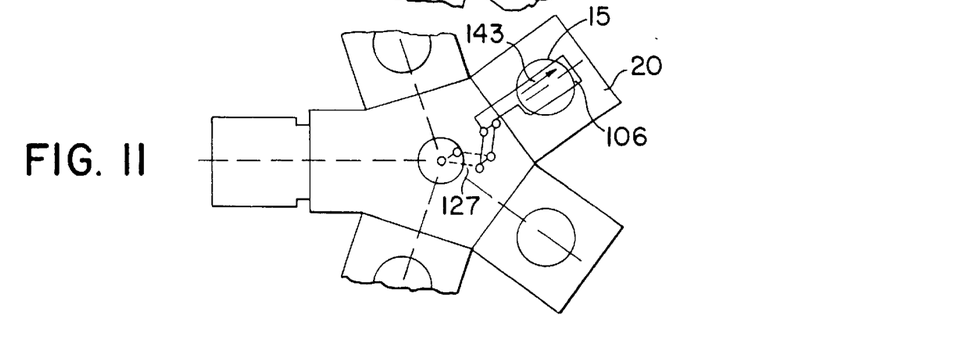

As one example of an overall sequence of operation of the robot 80, FIGS. 7–11 depict the robot's R-Θ movement in moving a wafer 15 (FIG. 7) from external cassette elevator 24 to internal elevator 50 and then into process chamber 20 (FIG. 11).

Initially, as is also depicted in FIG. 3, rotation of drive arm 127 by shaft 98 extends the blade 106 into cassette 28, then downward indexing of the cassette 28 deposits a wafer 15 onto the vacuum pick end of the blade.

Figure 8:
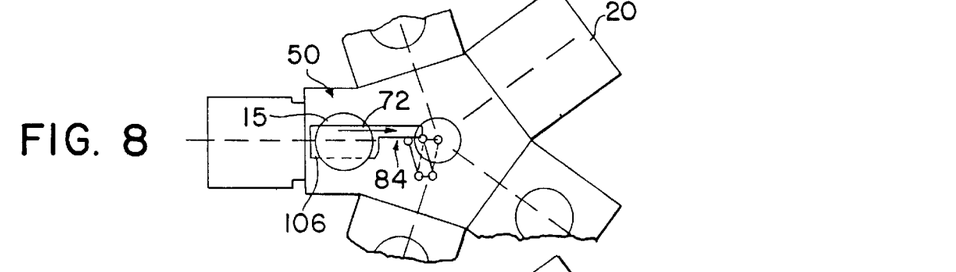
Figure 9:
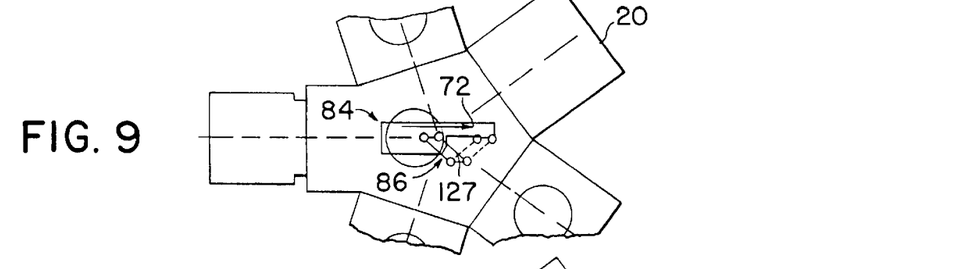

As shown in FIG. 8, reversed rotation of the shaft 98 and drive arm 127 (FIG. 2) retract the blade assembly 84 into the load lock chamber and position blade 106 at internal elevator 52. There, upward indexing of the elevator 52 deposits the wafer 15 on one of the cooperating spaced pairs of elevator support plates 54—54.

The blade assembly 84 is then retracted further to clear the internal elevator 50; the elevator is indexed downwardly to provide clearance for extension of the blade (see FIG. 2); the elevator 24 is indexed to position the next selected wafer for unloading by the blade 106, then the blade 106 is extended into the cassette 28 to initiate repetition of the above-described unloading cycle. The unloading and loading cycles are repeated until the internal load lock elevator 50 is loaded.

Next, the load lock slit valve 36 is closed by door 38 and the load lock chamber 14 and the process chambers are pumped down to vacuum under the control of computer 70. The elevator 50 is indexed to position a selected wafer 15 for unloading and the arm assembly 84 is extended to the position shown in FIG. 8 to position the blade 106 in the elevator 50 so that short downward elevator indexing deposits the selected wafer 15 onto the blade. Drive arm 127 is then rotated by inner shaft 98 to move the blade assembly 84, as indicated by arrow 72, to the fully retracted position shown in FIG. 9.

Rotation of the middle shaft 96 and flange 134 (FIG. 2) rotates the blade assembly 84 counterclockwise in the direction 74, FIG. 10, to position the blade 106 for insertion into a selected chamber, here chamber 20.

Next, as shown in FIG. 11, drive arm 127 is rotated by inner shaft 98 to extend the blade 106 and wafer 15 thereon into the process chamber 20 so the chamber's wafer exchange robot can unload the wafer 15 from blade 106 onto the chamber support or pedestal.

While an exemplary wafer transfer sequence between external elevator 24-to-internal elevator 50-to-process chamber such as 20 has been illustrated, as is obvious the computer 70 is programmed to unload wafers 15—15 from the chambers 16–22 into the load lock elevator 50, to unload the wafers in the elevator 50 into the cassettes 26 or 28, and to transfer a wafer from one process chamber such as 20 to another chamber 18, 20 or 22 to implement another processing step.

Exemplary Processing Chamber Robot Operation

As mentioned above, the above-described load lock chamber robot 80 preferably operates cooperatively with dedicated robots within the individual chambers 16–22. The load lock robot 80 presents wafer 15—15 to selected transfer points over associated wafer-supporting electrodes or susceptors within the chambers 16–22 for transfer to the process chamber robots, then retrieves the processed wafer 15, preferably at the same transfer points, from the process chamber robots for removal from the chambers.

1. CVD/PECVD Reactor

Figure 12:
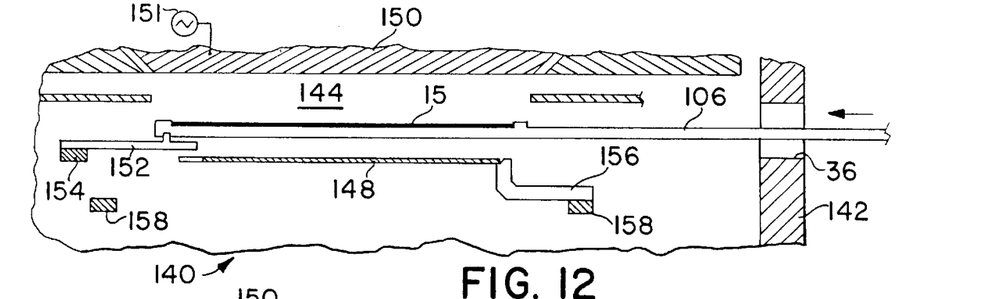
FIGS. 12–16 are sequential schematized cross-sectional representation of the dedicated, internal wafer transport system disclosed in the referenced CVD reactor during the process of transferring wafers from the external load lock blade to the reactor susceptor and returning wafers from the reactor susceptor to the load lock blade.
Figure 13:
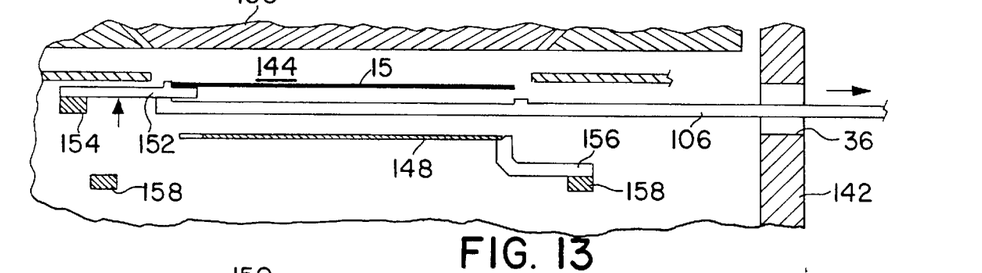
Figure 14:
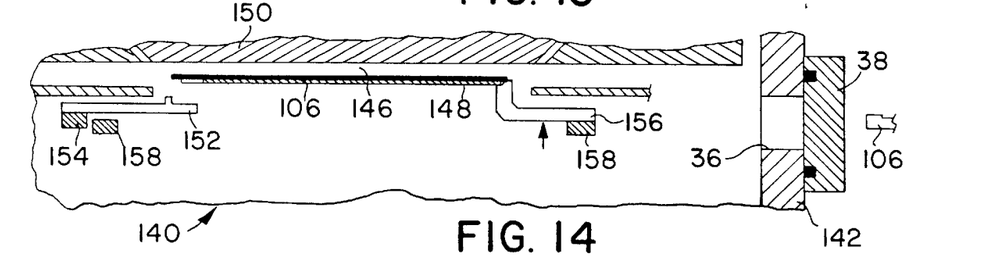

FIGS. 12 through 16 illustrate the operation of one suitable processing chamber robot wafer transfer mechanism 140, one which is used in the referenced CVD reactor patent application. The exemplary CVD reactor chamber comprises a circular housing 142 (also termed a "chamber"), typically made of aluminum, which defines an inner vacuum chamber 144 that has a processing region/plasma processing region 146 (FIG. 14). The CVD reactor also includes a wafer-holding susceptor 148. A process/purge gas manifold 150 applies process gas and deposition gas to the chamber 144. An RF power supply and matching network 151 (FIG. 12) is used to create and sustain a process gas plasma from the inlet gas (for PECVD operation) and a circular, near-infrared lamp heating system (not shown) is mounted beneath the susceptor 148 for heating the susceptor 148 and wafer 15 positioned thereon to effect deposition from the processing gas onto the wafer 15 (during thermal CVD and PECVD operation). Preferably, high frequency RF power of 13.56 MHz is used, but low frequencies have been used as well.

Referring further to FIG. 12, the dedicated wafer transport system 140 comprises a plurality of radially-extending wafer-support fingers 152—152 which are spaced about and are aligned with the periphery of the susceptor 148. These fingers are mounted to a semi-circular mounting bar or bracket 154. Similarly, an array of radially-extending susceptor-support fingers 156—156 are spaced circumferentially about the susceptor 148, interdigitated with the wafer support fingers 152—152, and are mounted to a semi-circular bar 158 positioned just inside bar 154. Because of the spacing between the adjacent fingers 152—152 and between the adjacent fingers 156—156, only one finger 152 and one finger 156 appears in the cross-sectional view of FIGS. 12–16. The arcuate mounting bars 154 and 158 are mounted within the housing 154 to standard vertically movable elevator assemblies (not shown) such as, for example, simple vertically movable shafts driven by stepper motors via suitable gear drive or pneumatic cylinders, under control of computer 70.

Referring still further to FIG. 12, in operation, the external load lock blade 106 (with the wafer 15 to be processed supported thereon) is inserted via opening 36 into chamber 144 to a position over the susceptor 148. In this starting position, the wafer fingers 152—152 are positioned between the susceptor 148 and the blade 106.

Next, as shown in FIG. 13, the wafer elevator mechanism is actuated by the computer 70 to raise the wafer-support fingers 152—152 above the load lock blade 106 to pick up the wafer 15. The blade 106 is then withdrawn from the chamber 142.

As shown in FIG. 14, after effecting retraction of the blade 106, computer 70 implements closing of the door 38 over the blade access slot 36 to seal chamber 142. Next, the susceptor elevator mechanism is actuated by the computer 70 to raise the susceptor-support fingers 156—156 and the susceptor 148 thereon so that the susceptor 148 lifts the wafer 15 from the fingers 152—152 into position for deposition in the processing area 146 immediately adjacent the gas distribution manifold 150.

Figure 15:
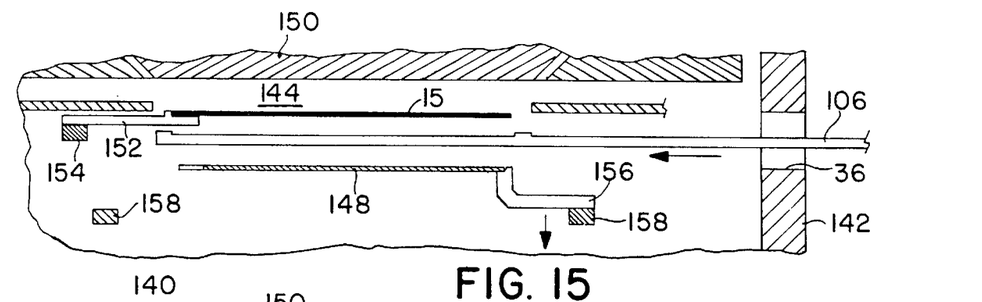
Figure 16:
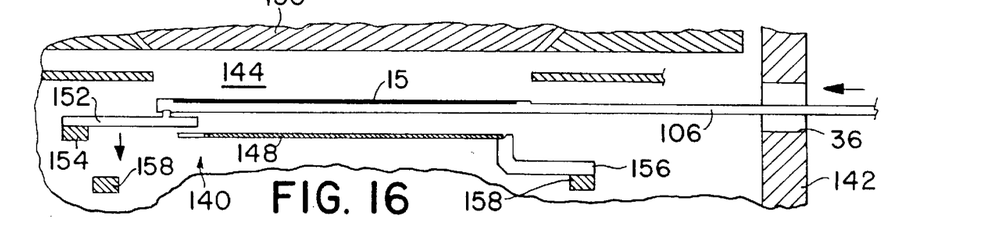

After processing, and referring to FIG. 15, the computer 70 actuates the susceptor elevator mechanism to lower the susceptor fingers 156—156 and the susceptor 148 thereon and deposit the wafer 15 onto the wafer support fingers 152—152. The door 38 is then opened and blade 106 is again inserted through the housing 142 into chamber 144. Next, as shown in FIG. 16, the wafer elevator mechanism is actuated by computer 70 to lower the wafer support fingers 152—152 and thereby deposit the wafer 15 onto the load lock blade 106. After the downwardly moving fingers 152—152 clear the blade 106, the blade 106 is again retracted by the computer 70, leaving the fingers 152—152 and 156—156 in the position shown in FIG. 12 ready for another wafer insertion processing and withdrawal cycle.

2. Etch Reactor

Figure 17:
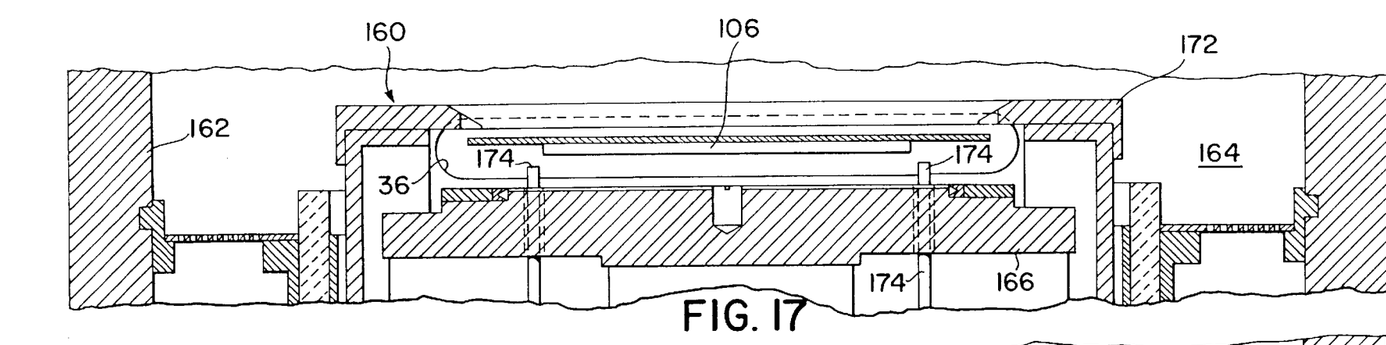
FIGS. 17–19 are sequential schematized cross-sectional representation of the dedicated, internal wafer transport system disclosed in the referenced etch reactor during the process of transferring wafers from the external load lock blade to the reactor wafer support electrode and returning wafers from the reactor wafer support electrode to the load lock blade.
Figure 18:
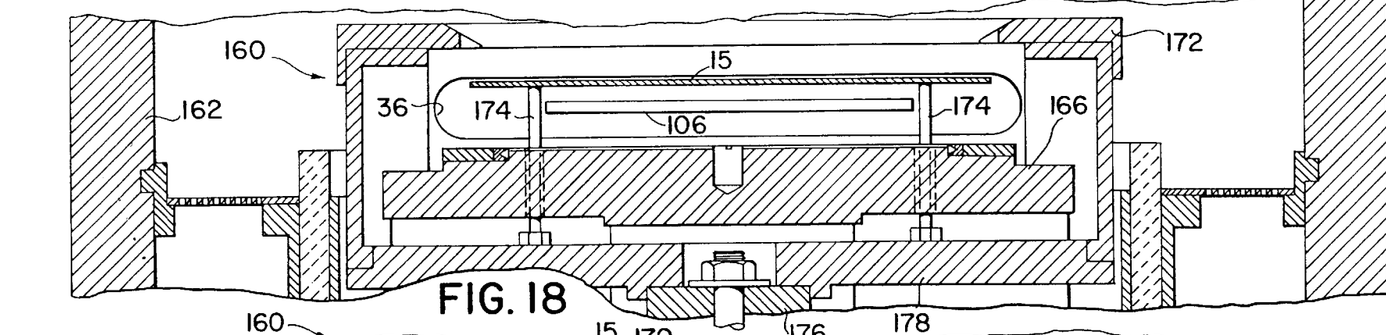
Figure 19:
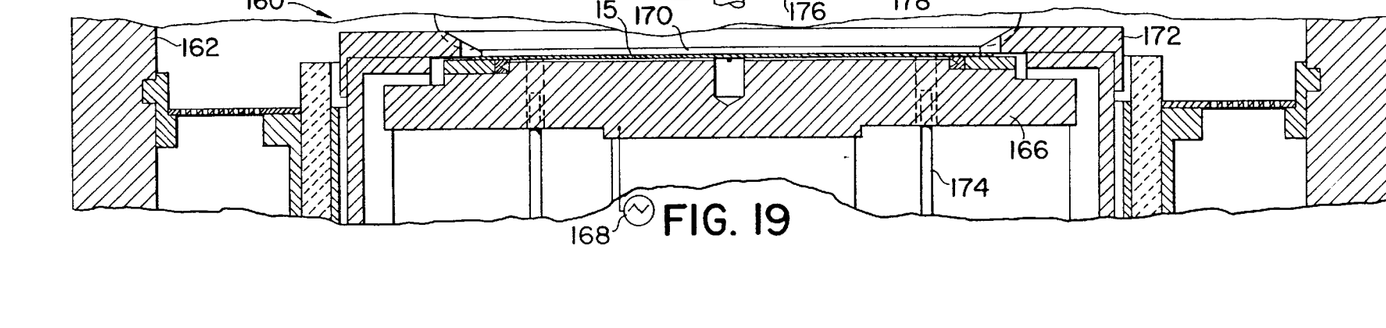

FIGS. 17–19 depict an alternative internal wafer transport system 160, one which is used in the etch reactor disclosed in the referenced etch reactor patent application.

The etch reactor chamber comprises a housing 162, typically of non-magnetic material such as aluminum, which defines internal etch chamber 164.

The reactor system also includes a liquid-cooled cathode 166. Provision is made for applying a gas such as helium between the wafer 15 and the upper surface of the electrode 166 when the wafer 15 is positioned on the electrode (see FIG. 19). The gas is applied at a pressure of, for example, about 4 torr to enhance the thermal conductivity between the wafer 15 and the liquid-cooled electrode 166.

Electrical energy is applied to the powered wafer-supporting electrode 166 from an RF power supply 168 (FIG. 19), preferably at a high frequency, although low frequency can be used.

Process gases are supplied to the interior chamber 164 by a gas manifold (not shown) from a gas supply system comprising one or more gas storage sources. The gas manifold is positioned over and closely spaced to the electrode 166 for applying process gas to the process chamber 170 (FIG. 19).

The etch reactor also includes two pair of vertical magnetic coils mounted on opposite walls of the chamber 162 for providing a rotatable field parallel to the plane of wafer 15. The magnetic field enhances the etching effectiveness of the reactor, including etch rate and uniformity. The magnetic coils are controlled by the computer 70 for providing a precisely controlled magnetic field that is preferably rotated at a few cycles per minute by the simple expedient of sequentially reversing current to the sets of coils.

The wafer exchange system 160 integrally incorporates a multiplicity of vertically-extending wafer support pins 174—174. The pins 174—174 are arranged in a circular configuration and extend through holes in the periphery of the electrode 166. The wafer exchange system 160 may also incorporate a wafer clamp ring 172. Both the wafer support fingers 174—174 and the wafer clamping ring 172 are mounted to a support arm means which comprises a horizontally-extending arm 178—178 (only one radial support arm 178 is shown in the cross-section of FIGS. 17–19) mounted to lift shaft 176 (FIG. 18) for vertical displacement. Vertical movement of the shaft 176, clamp ring 172 and wafer support pins 174—174 is effected by a pneumatic cylinder, the operation which is controlled by computer 70.

Referring further to FIG. 17, in operation, initially the assembly 160 is slightly elevated to permit insertion of the load lock blade 106 through door 36 and housing 162 and into the process chamber 170 (FIG. 19). Note, the fixed separation between the top of the wafer support pins 174—174 and the clamping ring 172 is aligned horizontally with the slit 36 in this position so that the blade 106 can pass between the pins 174—174 and the clamping ring 172 and into the plasma etching region 170 over the electrode 166.

Next, as shown in FIG. 18, the shaft 176 is actuated by computer 70 to raise the wafer transport mechanism 160 and cause the wafer support pins 174—174 to lift the wafer 15 from the blade 106.

After retraction of the blade 106, door 38 (FIG. 1) is closed over slit 36 and the computer 70 then effects the lowering of the shaft 176 and the associated wafer transport mechanism 160, thereby also lowering the clamping ring 172 to clamp the wafer 15 between the ring and the electrode 166.

After processing, the shaft 176 is raised under the control of computer 70 to elevate the pins 174—174 and thereby lift the wafer 15 above the door 36 so the blade 106 can be inserted into the chamber 164 beneath the wafer 15. Shaft 176 is then lowered slightly to position the pins 174—174 and the clamp in the position shown in FIG. 17 so the blade 106 can then be retracted from the chamber through the spacing between the pins and the clamp. A fresh wafer 15 can then be placed on the blade 106 and inserted into the chamber 164 between the clamp 172 and the pins 174—174 to initiate the start of another wafer exchange cycle.

As described above, the wafer exchange system 160 transfers wafers to and from the external load lock blade 106, clamps the wafers 15 and removes the wafers from the electrode 166 using only perpendicular, point and peripheral contact. The usual sliding and/or rolling friction contact is absent from the disclosed etch reactor system and its wafer exchange system 160, as well as from the disclosed CVD reactor system and its associated wafer exchange system 140. This reduces the tendency to generate particulates within the chambers, as does the positioning of the support and translation apparatus beneath the processing chambers.

In addition, the load lock chamber 14 can be used for below atmospheric pressure dry processing such as resist descumming, resist ashing and passivation. Moreover, but certainly not to exhaust the possibilities, elevator 50 can incorporate a separator plate 180 between upper and lower wafer sections. When positioned as shown in FIG. 2, the plate 180 effectively seals the load lock chamber 14 and the wafers above the plate from those below. This provides the capability for performing pre-processing and post-processing of the upper wafers in the load lock chamber without affecting the lower wafers. Quite obviously, the plate 180 could be eliminated or moved to a different position so that all wafers are subject to this load lock chamber processing step or so that a variable number of upper wafers are subjected to the processing. Also, unprocessed wafers can be stored above the plate 180 prior to processing and processed wafers stored below the plate preparatory to return to the external cassettes 26,28, or vice versa.

Figure 20:
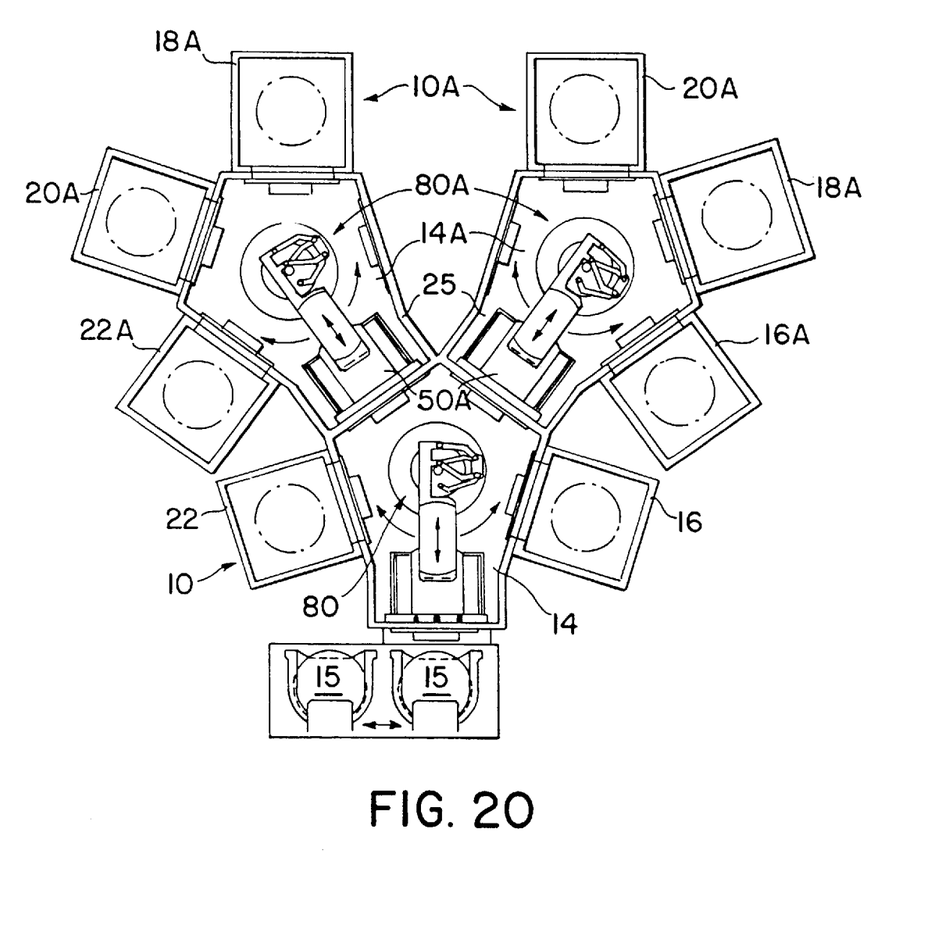
FIG. 20 is a top plan view partially schematized of an alternative embodiment of our multiple chamber integrated process system which incorporates an additional pair of multiple chamber process systems.

The system 10, FIG. 1, can be integrated with a load lock chamber or other chamber that allows the system to transfer wafers to another process system which is the same as or different from the present system 10. Referring to FIG. 20, there is shown one example of another system (actually, two systems) which are essentially identical to the present system 10, except that the external elevator 24 is not used. Accordingly, these two add-on systems are designated by the general reference numerals 10A. Systems 10A are mounted to system 10 in place of the two chambers 18 and 20. Also, while the depicted systems 10A have the same dimensions as system 10 and thus require the elimination of the chambers at the adjacent walls, this limitation is related to ease of representation and is not an inherent system limitation. For example, the dimensions of the sidewalls of the chamber 40A can be varied by lengthening the neck-like entrance 25 to allow use of the full complement of four chambers. Also, the chambers 10 and 10A are not limited to the illustrated pentagon configuration and can incorporate either more or fewer sides and, accordingly, more or fewer chambers. The illustrated systems 10A use load lock 14A and robot 80A (which can be essentially identical to the corresponding elements of the base system 10) to transfer wafers 15—15 between the storage elevator 50A and associated chambers 16A–22A. The main base system load lock 14 and robot 80 are used to transfer wafers between the storage elevator 50A of the add-on systems 10A and the base system.

In another exemplary approach, the "other" system such as 10A can be a batch system (for ion implantation or epitaxial processing, etc.). The other system (and system 10) may incorporate a load lock chamber that performs below atmospheric pressure pre-processing or post-processing, or performs atmospheric pressure processing such as wet cleaning.

As is also quite apparent, the described multiple chamber process system can incorporate a single type of process capability (such as etching or chemical vapor deposition) in all chambers 16 through 22 or can mix etch and deposition chambers. Furthermore, chambers for other types of processing such as sputtering and rapid thermal annealing can be used alone or mixed with other process chambers. For example, the reactor chamber disclosed in the above-referenced CVD reactor patent application can be used for sputter etching. Also, Raicu U.S. Pat. No. 4,561,907, issued Dec. 31, 1985, which is hereby incorporated by reference in its entirety, describes an applicable single wafer rapid thermal annealing approach. The system 10 is thus adaptable to a very large number of different chamber combinations and process sequences using etch, deposition, sputtering, rapid thermal anneal and other process steps in-situ without breaking system vacuum.

Having thus described preferred and alternative embodiments of our multiple chamber integrated process system, what is claimed is:

1. An integrated workpiece vacuum processing system comprising:

a vacuum transfer chamber having a closable entrance;

a first vacuum processing chamber mounted to said transfer chamber and communicating therewith by means of an opening in said processing chamber, said first processing chamber adapted to perform a process selected from the group consisting of chemical vapor deposition, etching, heat treatment and sputtering on a workpiece, said first processing chamber fitted with a workpiece support;

a second vacuum processing chamber mounted to said transfer chamber and communicating therewith by means of an opening in said second processing chamber, said second processing chamber adapted to perform a process selected from the group consisting of chemical vapor deposition, etching, heat treatment and sputtering on a workpiece, said second processing chamber fitted with a workpiece support and performing a different process than said first chamber;

an internal elevator in said transfer chamber having a number of workpiece mounting positions and being adapted for selectively moving said workpiece mounting positions to a first selected position internal to and adjacent to the transfer chamber entrance; and a robot in said transfer chamber to deliver said workpieces to said workpiece support in any of said first and second processing chambers for processing.

2. An integrated workpiece vacuum processing system according to claim 1 wherein said robot includes a workpiece support blade.

3. An integrated workpiece vacuum processing system according to claim 2 further comprising an external elevator mounted outside the transfer chamber, said external elevator having a number of workpiece mounting positions and being movable for selectively locating said workpiece mounting positions at a selected load lock position external to and adjacent to the transfer chamber entrance for transferring a workpiece to and from said workpiece support blade.

4. An integrated workpiece vacuum processing system according to claim 3 wherein said robot is adapted to retrieve a workpiece from said external load lock chamber elevator and deliver it to a workpiece mounting position on said internal elevator.

5. An integrated workpiece vacuum processing system according to claim 2 wherein said workpiece support blade has a source of vacuum directly connected thereto.

6. An integrated workpiece vacuum processing system according to claim 1 wherein said internal elevator is fitted with a plate intermediate first and second groups of workpiece positions for sealing said first group of workpieces within the transfer chamber and isolating said second group of workpieces from the transfer chamber.

7. An integrated workpiece vacuum processing system according to claim 6 wherein said transfer chamber is fitted with a gas inlet for supplying a gas to condition said first group of workpieces.

8. An integrated workpiece vacuum processing chamber according to claim 1 wherein one of said processing chambers is an etching chamber and another of said processing chambers is a chemical vapor deposition chamber.

* * * * *